United States Patent
Pelley et al.

(10) Patent No.: US 9,928,182 B2
(45) Date of Patent: Mar. 27, 2018

(54) DIRECT INTERFACE BETWEEN SRAM AND NON-VOLATILE MEMORY PROVIDING SPACE EFFICIENCY BY MATCHING PITCH IN BOTH MEMORIES

(71) Applicant: FREESCALE SEMICONDUCTOR, INC., Austin, TX (US)

(72) Inventors: Perry H. Pelley, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/012,945

(22) Filed: Feb. 2, 2016

(65) Prior Publication Data
US 2017/0220491 A1 Aug. 3, 2017

(51) Int. Cl.
| | |
|---|---|
| G11C 11/34 | (2006.01) |
| G06F 13/10 | (2006.01) |
| G11C 14/00 | (2006.01) |
| G06F 13/16 | (2006.01) |
| G06F 13/28 | (2006.01) |
| G06F 3/06 | (2006.01) |

(52) U.S. Cl.
CPC .......... *G06F 13/102* (2013.01); *G06F 3/0604* (2013.01); *G06F 3/0647* (2013.01); *G06F 3/0685* (2013.01); *G06F 13/16* (2013.01); *G06F 13/28* (2013.01); *G11C 14/009* (2013.01); *G11C 14/0054* (2013.01); *G11C 14/0081* (2013.01)

(58) Field of Classification Search
None
See application file for complete search history.

(56) References Cited

U.S. PATENT DOCUMENTS

| | | | |
|---|---|---|---|
| 6,052,302 | A | 4/2000 | Moyer et al. |
| 6,457,108 | B1 | 9/2002 | Hsu et al. |
| 7,791,941 | B2 | 9/2010 | Hanafi |
| 8,295,079 | B2 | 10/2012 | Yamamoto et al. |
| 8,422,295 | B1 | 4/2013 | Lin et al. |
| 8,427,891 | B2 | 4/2013 | Best |
| 9,576,661 | B2 | 2/2017 | Roy et al. |

(Continued)

OTHER PUBLICATIONS

Fujita, Shinobu et al: "Novel Nonvolatile L1/L2/L3 Cache Memory Hierarchy Using Nonvolatile-SRAM Wth Voltage-Induced Magnetization Switching and Ultra Low-Write-Energy MTJ", IEEE Transactions on Magnetics, vol. 49, No. 7, Jul. 2013, pp. 4456-4459.

(Continued)

*Primary Examiner* — Son Dinh
*Assistant Examiner* — Sultana Begum (57) ABSTRACT

A memory system comprises an SRAM array and a NVM array. The SRAM array and NVM array are both organized in rows and columns. The NVM array is directly coupled to the SRAM array. The memory system may also be coupled to a system bus of a data processing system. The number of columns of the NVM array is an integer multiple of the number of columns of the SRAM array, where the integer multiple is greater than one. Column logic is coupled to the SRAM array and to the NVM array. The column logic controls accesses to the SRAM and to the NVM array, and the column logic controls direct data transfers between the SRAM array and the NVM array.

20 Claims, 5 Drawing Sheets

(56) References Cited

U.S. PATENT DOCUMENTS

| | | | |
|---|---|---|---|
| 2006/0193174 A1* | 8/2006 | Choi | G11C 14/00 365/185.08 |
| 2014/0085978 A1* | 3/2014 | Lee | G11C 14/0063 365/185.08 |
| 2016/0019964 A1 | 1/2016 | Sadd et al. | |
| 2016/0055920 A1* | 2/2016 | Lee | G11C 17/18 365/96 |

OTHER PUBLICATIONS

Abe, Keiko et al: "Novel Hybrid DRAM/MRAM Design for Reducing Power of High Performance Mobile CPU", Electron Devices Meeting (IEDM), 2012 IEEE International, San Francisco, CA, Dec. 10-13, 2012, pp. 10.5.1-10.5.4.

\* cited by examiner

DIRECT INTERFACE BETWEEN SRAM AND NON-VOLATILE MEMORY PROVIDING SPACE EFFICIENCY BY MATCHING PITCH IN BOTH MEMORIES

BACKGROUND

Field

This disclosure relates generally to electronic circuits and more specifically to a circuit to directly interface a static random access memory (SRAM) with a non-volatile memory.

Related Art

Some data processing systems include a volatile memory, such as SRAM, and a type of non-volatile memory. The non-volatile memory may be, for example, a flash memory, or a resistive non-volatile memory such as a resistive random access memory (RRAM) or a magnetic random access memory (MRAM). Volatile memory types lose their stored states when powered down while non-volatile memory types retain their stored states. Because SRAM is faster than most types of memory, normal operations may be carried out using the SRAM and then, when the system is to be powered down, information that is to be retained while the power is off is stored in the non-volatile memory. When power is restored, the data stored in non-volatile memory is reloaded in the SRAM. Thus, normal operations are achieved with the SRAM with the attendant benefits thereof and the non-volatile function is present when power is removed. However, in a data processing system such as a system-on-a-chip (SoC), typically the SRAM and non-volatile memory are each coupled to a system bus using a bus interface circuit. The bus interface circuit may involve using a processor or direct memory access (DMA) controller to access the memory. Anytime a memory is accessed, or when data is transferred between components coupled to the bus, the bus cannot be used by another component of the data processing system while the transfer is taking place. Also, most SRAM cells include at least six transistors and therefore an SRAM array occupies a much larger surface area of an integrated circuit than a correspondingly sized non-volatile memory array.

Therefore, a need exists for a memory system that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a data processing system having SRAM and a non-volatile memory such as flash or MRAM. The SRAM and the non-volatile memory are connected together using a direct interface specifically for transferring data between the SRAM and the non-volatile memory. The SRAM and the non-volatile memory may also be coupled to the system bus through a bus interface. Accesses between the SRAM and non-volatile memory can occur without involving the system bus. The memory system is more space efficient because the SRAM and the non-volatile memory are pitch matched, allowing a number of columns of non-volatile memory to be placed within the width, or pitch, of one column of the SRAM. Burst accesses are used when directly transferring data from the non-volatile memory to the SRAM. In a partitioned system, the SRAM and non-volatile memory may each include multiple partitions. One partition may serve as backup while another partition is being accessed.

In one embodiment, there is provided, a memory system comprising: a static random access memory array, the static random access memory array organized in rows and columns, wherein a column comprises a first plurality of memory cells and a row comprises a second plurality of memory cells; a non-volatile memory array coupled to the static random access memory array, the non-volatile memory array having a plurality of non-volatile memory cells organized in rows and columns, wherein a column of non-volatile memory cells comprises a third plurality of non-volatile memory cells and a row comprises a fourth plurality of non-volatile memory cells, and wherein the fourth plurality of non-volatile memory cells is an integer multiple of the second plurality of memory cells, wherein the integer multiple is greater than one; and column logic coupled to the static random access memory array and to the non-volatile memory array, the column logic for controlling accesses to the static random access memory and to the non-volatile memory array; and for controlling a data transfer between the static random access memory array and the non-volatile memory array. The integer multiple may be determined by a relative pitch between a layout of a static random access memory cell and a non-volatile memory cell. The plurality of non-volatile memory cells may be characterized as being a plurality of resistive non-volatile memory cells. The plurality of resistive non-volatile memory cells may be further characterized as being magnetic random access memory cells. The memory system may be a part of a data processing system having a processor and a system bus, wherein the data transfer is accomplished without involving the system bus. During a data transfer from the non-volatile memory array to the static random access memory array, an integer multiple number of rows of the static random access memory array map to one row of the non-volatile memory array. The memory system may be a part of a data processing system having a processor and a system bus, wherein both the static random access memory and the non-volatile memory are read and write accessible from the system bus. The memory system may be a part of a data processing system having a processor and a system bus, wherein the processor is one of either a central processing unit or direct memory access unit, and wherein the data transfer is accomplished without involving the processor or the system bus. The integer multiple may be equal to 4.

In another embodiment, there is provided, a memory system, comprising: a static random access memory array having a plurality of memory cells organized in rows and columns; a resistive non-volatile memory array having a plurality of memory cells organized in rows and columns, wherein a number of columns of the resistive non-volatile memory array is an integer multiple of a number of columns of the static random access memory, the integer multiple being determined by a relative pitch between a layout of a static random access memory cell and a resistive non-volatile memory cell; and column logic coupled to the static random access memory array and to the non-volatile memory array, the column logic for controlling accesses to the static random access memory and to the non-volatile memory array; and for controlling a data transfer between the static random access memory array and the non-volatile memory array. The resistive non-volatile memory array may comprise a plurality of one of either magnetic random access memory cells or resistive random access memory cells. The memory system may be part of a data processing system comprising a processor coupled to a system bus, the memory system coupled to the system bus, and wherein the data transfer occurs without involving the processor and the system bus. The memory system may be a part of a data processing system having a processor and a system bus, wherein both the static random access memory and the resistive non-volatile memory are read and write accessible from the system bus. The static random access memory array and the resistive non-volatile memory array may comprise a same number of memory cells. The integer multiple may be equal to 4.

In yet another embodiment, there is provided, a data processing system comprising: a system bus; a processor coupled to the system bus; and a memory system, coupled to the system bus, the memory system comprising: a static random access memory array having a plurality of memory cells organized in rows and columns; a resistive non-volatile memory array having a plurality of memory cells organized in rows and columns, wherein a number of columns of the resistive non-volatile memory array is an integer multiple of a number of columns of the static random access memory, the integer multiple being determined by a relative pitch between a layout of a static random access memory cell and a resistive non-volatile memory cell; and column logic coupled to the static random access memory array and to the non-volatile memory array, the column logic for controlling accesses to the static random access memory and to the non-volatile memory array; and for controlling a data transfer between the static random access memory array and the non-volatile memory array without involving the processor or the system bus. The static random access memory array may comprise a plurality of six-transistor memory cells. The processor may be one of either a central processing unit or direct memory access unit. The resistive non-volatile memory array may be further characterized as being a magnetic random access memory array. Both the static random access memory and the resistive non-volatile memory may be read and write accessible from the system bus.

Figure 1:
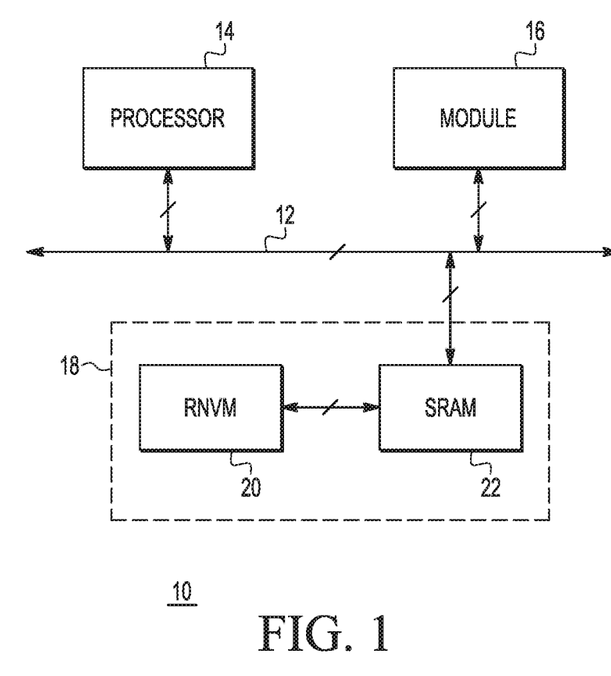
FIG. 1 illustrates a data processing system in accordance with an embodiment.

FIG. 1 illustrates data processing system 10 in accordance with an embodiment. Data processing system 10 may be implemented on a single integrated circuit using a conventional manufacturing process such as for example, a complementary metal-oxide semiconductor (CMOS) process. Data processing system 10 includes system bus 12, processor 14, module 16, and memory system 18. Processor 14, module 16, and memory system 18 are each bi-directionally connected to system bus 12. Memory system 18 includes a resistive non-volatile memory (RNVM) 20 and SRAM 22. In one embodiment, data processing system 10 is a system-on-a-chip (SoC). Bus 12 can be any type of bus for communicating any type of information such as data, address, or instructions. Processor 14 may be any type of processor such as a microprocessor (MPU), microcontroller (MCU), digital signal processor (DSP), or other type of processing core. There may be multiple processors like processor 14 on the data processing system integrated circuit. Module 16 includes circuits for providing specific functionality to data processing system 10, such as audio processing, video processing, wifi, arithmetic logic unit (ALU), etc. Module 16 may include multiple modules. There may be an interface coupling memory system 18 to bus 12. There is a direct interface for facilitating accesses between RNVM 20 and SRAM 22. RNVM 20 may be one of several types of resistive non-volatile memory such as resistive random access memory (RRAM) or magnetic random access memory (MRAM). Also, in other embodiments, RNVM 20 may be another type of non-volatile memory such as flash memory or electrically erasable programmable read only memory (EEPROM). Certain types of resistive non-volatile memory, such as MRAM, have the advantage of being faster to program and erase than many other types of non-volatile memories such as flash memory. However, MRAM is still slower to access than SRAM. Memory system 18 will be discussed in more detail below.

Figure 2:
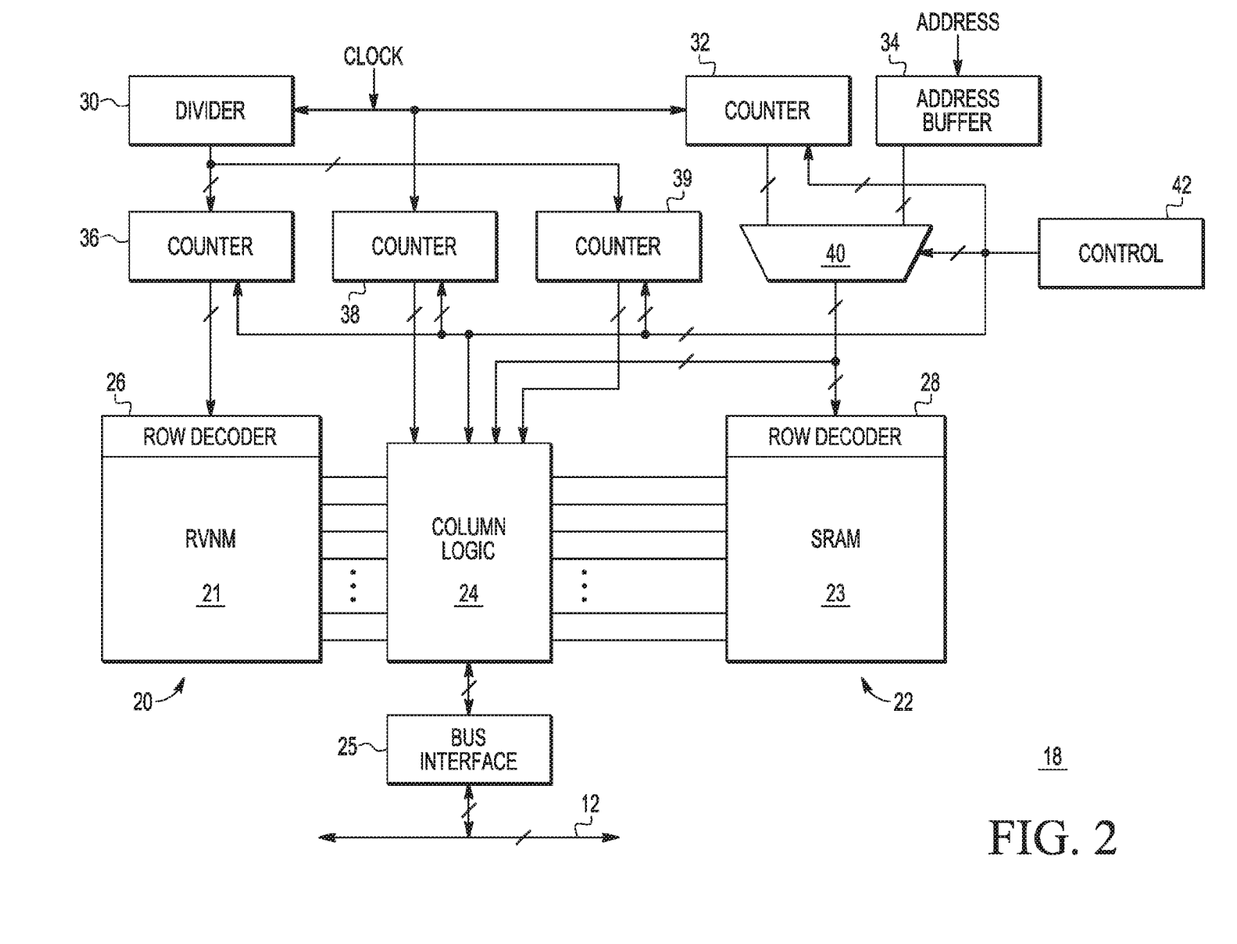
FIG. 2 illustrates the memory system of FIG. 1 in accordance with an embodiment.

FIG. 2 illustrates memory system 18 of FIG. 1 in accordance with an embodiment. Memory system 18 includes RNVM 20, SRAM 22, column logic 24, bus interface 25, divider 30, counters 32, 36, and 38, address buffer 34, and control circuit 42. RNVM 20 includes RNVM array 21 and row decoder 26. SRAM 22 includes SRAM array 23 and row decoder 28. SRAM array 23 includes a plurality of SRAM cells organized in rows and columns. RNVM array 21 includes a plurality of RNVM cells organized in rows and columns. Column logic 24 includes circuitry necessary for transferring data between RNVM 20 and SRAM 22 and bus interface 25, and for transferring data directly between RNVM 20 and SRAM 22 without use of bus interface 25. SRAM array 23 may be accessed by way of system bus 12 and bus interface 25 for supplying or receiving data. Address buffer 34 supplies address signals ADDRESS under the control of control circuit 42. The address may be forwarded to row decoder 28 and column logic 24 by multiplexer 40. Row decoder 28 accesses word lines not shown based on their respective address inputs. Column logic 24 selects a column based on the address signals ADDRESS. In some embodiments, access of RNVM 20 is accomplished similarly.

Since there are more RNVM cells on the RNVM word line the word line needs to be incremented less often than the word line of the SRAM when transferring data between the memories. Divider 30 is provided to lower the clock frequency of the clock that is provided to RNVM 20 so the word line increments less often than the word line of SRAM 23. SRAM 23 has fewer column addresses in compensation for the larger number of word lines in SRAM 23. Therefore, the clock increments counter 32 to supply address to row decoder 28 of SRAM 23 through multiplexer 40 while the output of divider 30 clocks counters 36 and 39 to select a word line in RNVM 21 and column addresses for SRAM 23 at a rate reduced by divider 30. The counters may be directly loaded with corresponding addresses (not shown) or reset for a full memory transfer. Once initialized by a starting address, counters 32, 36, 38, and 39 are clocked to transfer data to successive addresses from the starting address. In this manner data is transferred between the SRAM array 23 and RNVM array 21 in either direction under the control of control 42.

Figure 3:
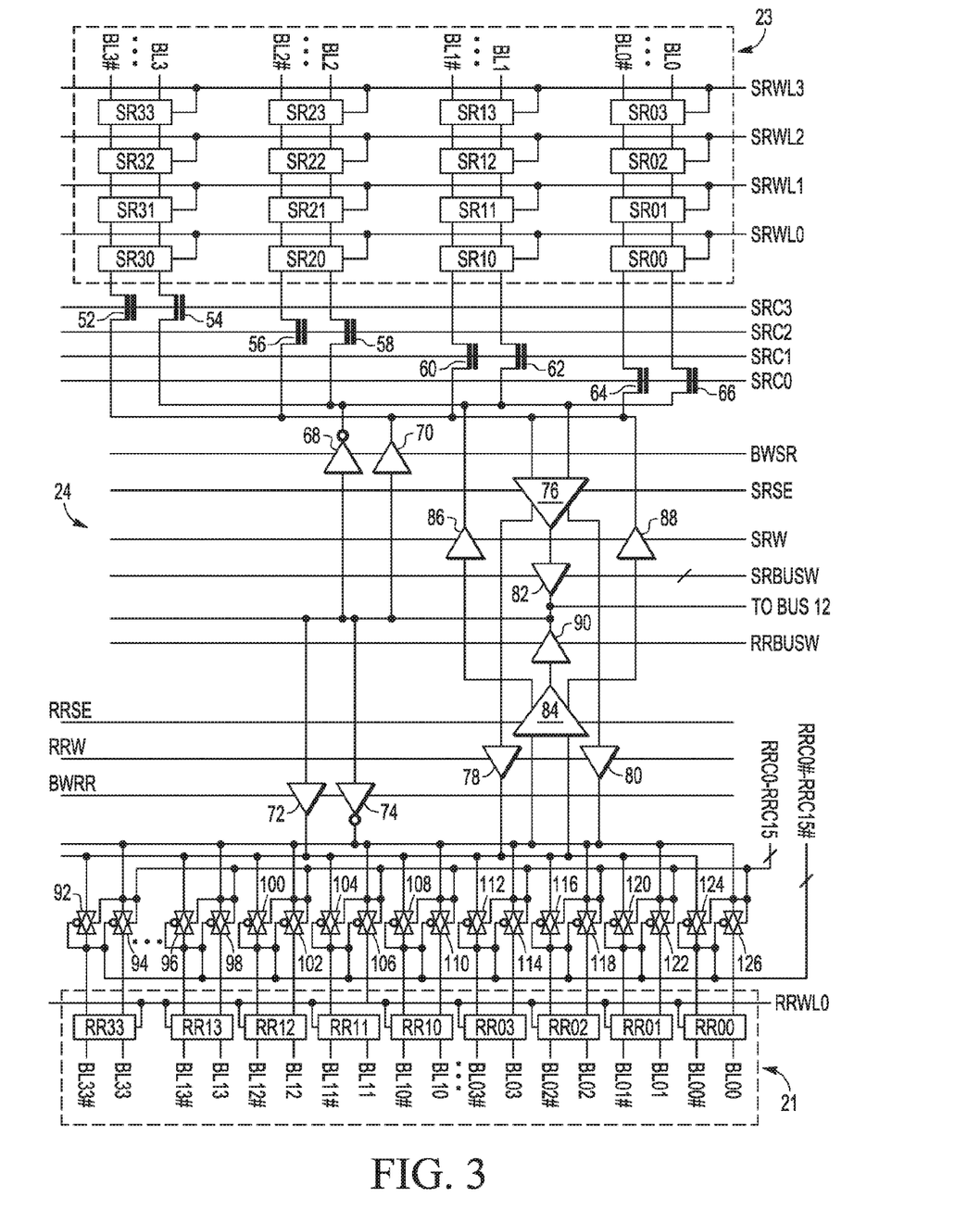
FIG. 3 illustrates a portion of the memory system of FIG. 2 in accordance with an embodiment.

FIG. 3 illustrates a portion of memory system 18 of FIG. 2 in accordance with an embodiment. RNVM 21 includes a plurality of memory cells including memory cells labeled RR00-RR33. Each of the memory cells is coupled to a bit line pair. For example, memory cell RR00 is coupled to bit lines BL00 and BL00#, where the pound sign (#) indicates that a signal ending with # is a logical complement of a signal having the same name but lacking the #. A column of memory cells includes a bit line pair and all of the memory cells coupled to the bit line pair. In other embodiments, there may only be a single bit line per column instead of a bit line pair. A row of memory cells is a word line and all of the memory cells coupled to the word line. A row of memory cells in RNVM array 21 is coupled to a word line labeled RRWL0. Likewise, in SRAM array 23, a plurality of memory cells are arranged in rows and columns, where a row includes all of the memory cells coupled to a word line and a column includes all of the memory cells coupled to a bit line pair. For example, one column includes memory cells labeled SR00-SR03 coupled to bit line pair BL0 and BL0#.

In column logic 24, N-channel column select transistors 52, 54, 56, 58, 60, 62, 64, and 66 are gated by column select signals labeled SRC0-SRC3 and are used to couple a selected column of memory cells to RNVM array 21 to system bus 12. Transmission gates 92, 94, 96, 98, 100, 102, 104, 106, 108, 110, 112, 114, 116, 118, 120, 122, 124, and 126 function as column select gates and are used to couple a column of RNVM cells to SRAM array 23 or to system bus 12 in response to one of column select signals RRC0-RRC15/RRC0#-RRC15#. As indicated in FIG. 3, each transmission gate is a conventional transmission gate having an N-channel transistor connected in parallel with a P-channel transistor.

As can be seen in FIG. 3, for ease of illustration, 16 bits of four columns and four rows of SRAM array 23 are mapped to 16 bits of one row of RNVM array 21. This means that in the illustrated embodiment, during a direct transfer between SRAM array 23 and RNVM array 21, a row of RNVM array 21 is transferred to four rows of SRAM array 23. In the illustrated embodiment, the number of SRAM columns that are mapped to a row of RNVM array 21 is determined by the relative pitch of one SRAM cell to one RNVM cell. If the SRAM cell has a pitch that is approximately four times greater than a pitch of an RNVM cell, then four RNVM cells will fit within the SRAM cell pitch. By mapping the number of columns of RNVM cells to SRAM cells based on pitch, then more efficient use of surface area on an integrated circuit results.

Still referring to FIG. 3, column logic 24 includes tristate drivers 68, 70, 72, 74, 78, 80, 82 86, 88 and 90, and sense amplifiers 76 and 84. Tristate drivers 68 and 74 also provide a signal inversion function. The tristate drivers and sense amplifiers of column logic 24 are enabled for various operations by control signals provided by control circuit 42. For example, tristate driver circuits 68 and 70 provide for data transfer from bus 12 to SRAM array 23 in response to a bus write signal BWSR from control circuit 42. Tristate driver circuits 68 and 70 have input terminals coupled to a conductor of system bus 12 and the column select transistors of SRAM array 23. Tristate driver circuit 68 also provides an inversion function, so that tristate drivers 68 and 70 together allow a single-ended signal on bus 12 to be converted to a differential signal for use by SRAM array 23. Likewise, tristate driver circuits 72 and 74 convert a single-ended signal from system bus 12 to a differential signal for use by RNVM 21. Sense amplifier 76 has differential inputs coupled to the column select transistors of SRAM array 23, and differential outputs coupled to tristate driver circuits 78 and 80. During a read operation of SRAM array 23 for a data transfer to RNVM array 21, sense amplifier 76 is responsive to sense enable control signal SRSE and tristate drivers 78 and 80 are enabled by RNVM write signal RRW to allow data to be written to RNVM array 21. For a read operation of SRAM array 23 to system bus 12, sense amplifier 76 is enabled by asserting SRAM sense enable signal SRSE and tristate driver 82 is enabled by SRAM bus write signal SRBUSW. For a write operation from system bus 12 to RNVM array 21, tristate drivers 72 and 74 are enabled by asserting bus write signal BWRR. Data is transferred from RNVM array 21 to SRAM array 23 via sense amplifier 84 and tristate drivers 86 and 88. Data provided to the differential input terminals for sense amplifier 84 is output when sense enable signal RRSE is asserted. Tristate drivers 86 and 88 are enabled by asserting SRAM write signal SRW. Data is transferred from RNVM array 23 to system bus 12 via sense amplifier 84 and tristate driver 90. During a write from RNVM array 23 to bus 12, sense amplifier 84 is enabled by asserting signal RRSE and tristate driver 90 by asserting RNVM bus write signal RRBUSW.

Figure 4:
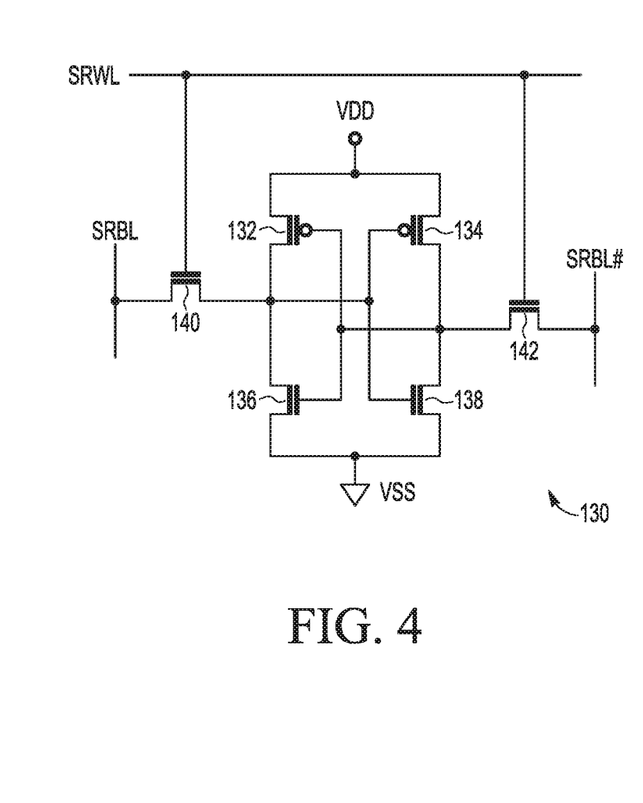
FIG. 4 illustrates, in schematic diagram form, an embodiment of an SRAM cell.

FIG. 4 illustrates, in schematic diagram form, a representative SRAM cell 130 of SRAM array 21. SRAM cell 130 includes P-channel transistors 132 and 134, N-channel transistors 136, 138, 140, and 142. P-channel transistor 132 and N-channel transistor 136 are coupled together to form an inverter. P-channel transistor 134 and N-channel transistor 138 are coupled to form another inverter. The two inverters are cross-coupled together with the input of one inverter coupled to the output of the other inverter. The inverters are coupled between power supply voltage terminals VDD and VSS. In one embodiment, VDD is coupled to receive a positive power supply voltage and VSS is coupled to ground. N-channel transistors 140 and 142 function as access transistors for two storage nodes of the cross-coupled inverters, and are made conductive to couple the storage nodes to bits SRBL and SRBL# in response to a word line signal SRWL.

Figure 5:
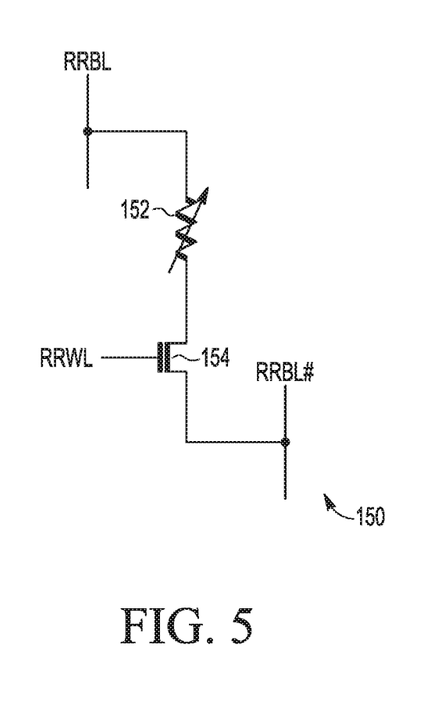
FIG. 5 illustrates, in schematic diagram form, an embodiment of a RNVM cell.

FIG. 5 illustrates, in schematic diagram form, RNVM cell 150 that may be used in RNVM array 21. RNVM cell 150 includes a resistive element 152 and a select N-channel transistor 154. Resistive element 152 has one terminal connected to a bit line labeled RRBL and another terminal connected to a drain of N-channel transistor 154. N-channel transistor 154 has a gate for receiving a word line signal RRWL, and a source connected to bit line RRBL#. RNVM cell 150 stores a logic state by being programmed to have either a high resistance state or a low resistance state. During a read operation, the stored resistance state is determined and translated as a logic one or logic zero. The manner in which RNVM cell 150 is programmed or erased depends on the technology used to produce resistive element 152.

Figure 6:
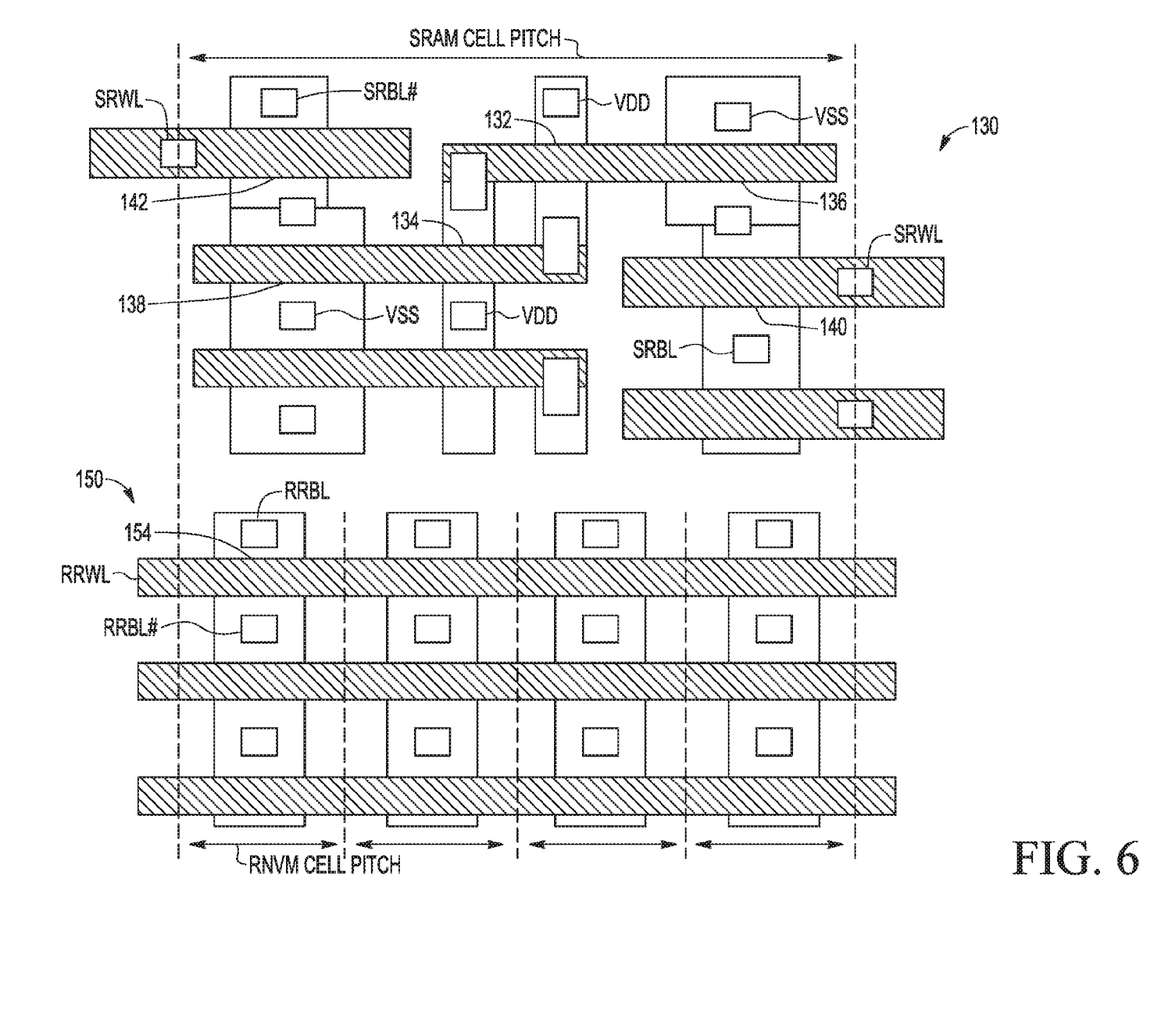
FIG. 6 illustrates an example layout of each of the SRAM cell of FIG. 4 and the RNVM cell of FIG. 5.

FIG. 6 illustrates an example layout of each of the SRAM cell 130 of FIG. 4 and the RNVM cell 150 of FIG. 5 on a semiconductor substrate. In one embodiment, the substrate is silicon. The unshaded areas are diffusion areas in the surface of the semiconductor substrate and the shaded areas are polysilicon lines formed over the semiconductor substrate. Generally, where a polysilicon line crosses over a diffusion area a transistor is created. The pitch of SRAM cell 130 is marked with a bi-directional arrow at the top of the drawing. RNVM cell 150 pitch is marked at the bottom of the drawing. As can be seen, the pitch of SRAM cell 130 is approximately four times larger than the pitch of RNVM cell 150, so four RNVM cells can fit within the pitch of one SRAM cell with the illustrated layout. Other layouts or other cell types may provide a different relative pitch.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system comprising:
   a static random access memory array, the static random access memory array organized in rows and columns, wherein a column comprises a first plurality of memory cells coupled to a first bit line and a row comprises a second plurality of memory cells;
   a non-volatile memory array separate from the static random access memory array, the non-volatile memory array having a plurality of non-volatile memory cells organized in rows and columns, wherein a column of non-volatile memory cells comprises a third plurality of non-volatile memory cells coupled to a second bit line different than the first bit line and a row comprises a fourth plurality of non-volatile memory cells, and wherein the fourth plurality of non-volatile memory cells is an integer multiple of the second plurality of memory cells, wherein the integer multiple is greater than one; and
   column logic coupled between the columns of the static random access memory array and the columns of the non-volatile memory array, the column logic for controlling read and write accesses to either one of only the static random access memory or to only the non-volatile memory array, and for controlling read and write data transfers directly between the static random access memory array and the non-volatile memory array.

2. The memory system of claim 1, wherein the integer multiple is determined by a relative pitch between a layout of a static random access memory cell and a non-volatile memory cell.

3. The memory system of claim 1, wherein the plurality of non-volatile memory cells is characterized as being a plurality of resistive non-volatile memory cells.

4. The memory system of claim 3, wherein the plurality of resistive non-volatile memory cells is further characterized as being magnetic random access memory cells.

5. The memory system of claim 1, wherein the memory system is a part of a data processing system having a processor and a system bus, wherein the data transfer is accomplished without involving the system bus.

6. The memory system of claim 1, wherein during a data transfer between the static random access memory array and the non-volatile memory array, an integer multiple number of rows of the static random access memory array map to one row of the non-volatile memory array.

7. The memory system of claim 1, wherein the memory system is a part of a data processing system having a processor and a system bus, wherein both the static random access memory and the non-volatile memory are read and write accessible from the system bus.

8. The memory system of claim 1, wherein the memory system is a part of a data processing system having a processor and a system bus, wherein the processor is one of either a central processing unit or direct memory access unit, and wherein the data transfer is accomplished without involving the processor or the system bus.

9. The memory system of claim 1, wherein the integer multiple is equal to 4.

10. A memory system, comprising:
    a static random access memory array having a plurality of memory cells organized in rows and columns;
    a resistive non-volatile memory array having a plurality of memory cells organized in rows and columns, wherein a number of columns of the resistive non-volatile memory array is an integer multiple of a number of columns of the static random access memory, the integer multiple being determined by a relative pitch between a layout of a static random access memory cell and a resistive non-volatile memory cell; and
    column logic coupled to the static random access memory array and to the non-volatile memory array, the column logic for controlling accesses to the static random access memory and to the non-volatile memory array; and for controlling a data transfer between the static random access memory array and the non-volatile memory array.

11. The memory system of claim 10, wherein the resistive non-volatile memory array comprises a plurality of one of either magnetic random access memory cells or resistive random access memory cells.

12. The memory system of claim 10, wherein the memory system is part of a data processing system comprising a processor coupled to a system bus, the memory system coupled to the system bus, and wherein the data transfer occurs without involving the processor and the system bus.

13. The memory system of claim 10, wherein the memory system is a part of a data processing system having a processor and a system bus, wherein both the static random access memory and the resistive non-volatile memory are read and write accessible from the system bus.

14. The memory system of claim 10, wherein the static random access memory array and the resistive non-volatile memory array comprise a same number of memory cells.

15. The memory system of claim 10, wherein the integer multiple is equal to 4.

16. A data processing system comprising:
 a system bus;
 a processor coupled to the system bus; and
 a memory system, coupled to the system bus, the memory system comprising:
  a static random access memory array having a plurality of memory cells organized in rows and columns;
  a resistive non-volatile memory array having a plurality of memory cells organized in rows and columns, wherein a number of columns of the resistive non-volatile memory array is an integer multiple of a number of columns of the static random access memory, the integer multiple being determined by a relative pitch between a layout of a static random access memory cell and a resistive non-volatile memory cell; and
  column logic coupled to the static random access memory array and to the non-volatile memory array, the column logic for controlling accesses to the static random access memory and to the non-volatile memory array; and for controlling a data transfer between the static random access memory array and the non-volatile memory array without involving the processor or the system bus.

17. The data processing system of claim 16, wherein the static random access memory array comprises a plurality of six-transistor memory cells.

18. The data processing system of claim 16, wherein the processor is one of either a central processing unit or direct memory access unit.

19. The data processing system of claim 16, wherein the resistive non-volatile memory array is further characterized as being a magnetic random access memory array.

20. The data processing system of claim 16, wherein both the static random access memory and the resistive non-volatile memory are read and write accessible from the system bus.

* * * * *